United States Patent
Yamamoto

(10) Patent No.: US 7,305,221 B2
(45) Date of Patent: Dec. 4, 2007

(54) INTERMEDIATE FREQUENCY CIRCUIT OF TELEVISION TUNER

(75) Inventor: Masaki Yamamoto, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 508 days.

(21) Appl. No.: 11/061,042

(22) Filed: Feb. 17, 2005

(65) Prior Publication Data
US 2005/0206792 A1    Sep. 22, 2005

(30) Foreign Application Priority Data
Feb. 26, 2004    (JP) .............................. 2004-000867

(51) Int. Cl.
*H04B 1/10*    (2006.01)
(52) U.S. Cl. ...................... 455/283; 455/286; 455/296
(58) Field of Classification Search ................ 455/283, 455/323, 286, 334, 287, 290, 313, 319, 278.1, 455/196, 130, 189.1, 190.1; 348/725, 731, 348/21, 726
See application file for complete search history.

(56) References Cited

U.S. PATENT DOCUMENTS

| 4,263,619 A * | 4/1981 | Theriault .................... 348/736 |
| 6,876,402 B2 * | 4/2005 | Sasaki ......................... 348/731 |
| 7,209,188 B2 * | 4/2007 | Kawamura ................... 348/731 |
| 7,224,408 B2 * | 5/2007 | Yamamoto ................... 348/731 |
| 2002/0145681 A1 * | 10/2002 | Sasaki .......................... 348/731 |
| 2004/0153879 A1 * | 8/2004 | Fukutani et al. .............. 714/48 |
| 2004/0223087 A1 * | 11/2004 | Kawamura ................... 348/736 |
| 2005/0057697 A1 * | 3/2005 | Yamamoto ................... 348/731 |
| 2005/0062894 A1 * | 3/2005 | Yamamoto ................... 348/731 |

FOREIGN PATENT DOCUMENTS

| EP | 1 439 634 | 7/2004 |
| EP | 1 047 265 | 10/2005 |
| JP | 2001-196961 | 7/2001 |
| JP | 2003-318758 | 11/2003 |

\* cited by examiner

*Primary Examiner*—Sonny Trinh
(74) *Attorney, Agent, or Firm*—Brinks Hofer Gilson & Lione

(57) ABSTRACT

A mixer for tuning to an intermediate frequency signal, an intermediate frequency amplifier provided at a rear stage of the mixer, an intermediate frequency tuning circuit interposed between the mixer and the intermediate frequency amplifier for tuning to the intermediate frequency signal, and a trap circuit interposed between the mixer and the intermediate frequency amplifier for attenuating the signal of an adjacent channel are comprised. By connecting a first switch means to the trap circuit in parallel to turn on the first switch means, the RF characteristic at an input port of the intermediate frequency amplifier or an output port of the mixer can be observed, without being influenced by the trap circuit.

5 Claims, 2 Drawing Sheets

INTERMEDIATE FREQUENCY CIRCUIT OF TELEVISION TUNER

BACKGROUND OF THE INVENTION

1. Field of the Invention

This application claims the benefit of priority to Japanese Patent Application No. 2004-000867 filed on Feb. 26, 2004, herein incorporated by reference.

The present invention relates to an intermediate frequency circuit suitable for a television tuner.

2. Description of the Related Art

A conventional intermediate frequency circuit is shown in FIG. 3. A first capacitor 44 and a first inductor 45 are connected in parallel between a pair of input ports $41_1$, $41_2$ of an intermediate frequency input circuit 41, and an intermediate tap of the first inductor 45 is connected to a power supply terminal $41_5$. A parallel-connected circuit composed of a second capacitor 46 and a second inductor 47, a fourth capacitor 50 and a first resistor 51 are connected in series between one input port $41_1$ and one output port $41_3$, and a parallel-connected circuit composed of a third inductor 48 and a third capacitor 49, a fifth capacitor 52 and a second resistor 53 are connected in series between the other input port $41_2$ and the other output port $41_4$.

In addition, a collector of one transistor 54 in a frequency mixing circuit 42 is connected to one input port $41_1$, and a collector of the other transistor 55 therein is connected to the other input port $41_2$.

A base of one transistor 56 in an intermediate frequency amplifying circuit 43 is connected to one output port $41_3$, and a base of the other transistor 57 therein is connected to the other output port $41_4$.

The parallel-connected circuit composed of the first capacitor 44 and the first inductor 45 is tuned to an intermediate frequency, the parallel-connected circuit composed of the second capacitor 46 and the second inductor 47 forms a trap circuit which parallel-resonates at an intermediate frequency component of an upper-side adjacent channel, and the parallel-connected circuit composed of the third inductor 48 and the third capacitor 49 forms a trap circuit which parallel-resonates at an intermediate frequency component of a lower-side adjacent channel.

Further, an intermediate frequency signal output from the frequency mixing circuit is input to the intermediate frequency input circuit 41 through a pair of input ports $41_1$, $41_2$. In the intermediate frequency input circuit 41, the intermediate frequency signal is tuned by the parallel-connected circuit composed of the first capacitor 44 and the first inductor 45, unnecessary intermediate frequency component of the upper-side adjacent channel is removed by the parallel-connected circuit composed of the second capacitor 46 and the second inductor 47, and unnecessary intermediate frequency component of the lower-side adjacent channel is removed by the parallel-connected circuit composed of the third inductor 48 and the third capacitor 49.

Subsequently, the intermediate frequency signal is output to one output port $41_3$ through the fourth capacitor 50 and the first resistor 51 and to the other output port $41_4$ through the fifth capacitor 52 and the second resistor 53. The intermediate frequency signals from the pair of the output ports $41_3$, $41_4$ are input to the intermediate frequency amplifying circuit 43 (For example, see Patent Document 1).

[Patent Document 1]

Japanese Unexamined Patent Application Publication No. 2001-196961(FIG. 4)

Generally, the RF characteristic of a television tuner (the transfer characteristic up to the frequency mixing circuit 42) is observed by connecting a detector having a low impedance to the intermediate frequency input circuit 41 so that the characteristic of the intermediate frequency input circuit 41 does not appear. However, the RF characteristic is still influenced by the parallel resonance circuit (trap circuit) provided for removing the intermediate frequency component of the adjacent channel.

SUMMARY OF THE INVENTION

An object of the present invention is to eliminate the influence of the adjacent channel trap circuit so that the RF characteristic can be observed.

In order to solve the above-mentioned problems, an intermediate frequency circuit according to the present invention comprises a mixer for outputting an intermediate frequency signal; an intermediate frequency amplifier provided at a rear stage of the mixer; an intermediate frequency tuning circuit interposed between the mixer and the intermediate frequency amplifier for tuning to the intermediate frequency signal; and a trap circuit interposed between the mixer and the intermediate frequency amplifier for attenuating a signal of an adjacent channel, wherein a first switch means is connected in parallel to the trap circuit.

In addition, the intermediate frequency tuning circuit is constructed by a parallel-connected circuit composed of a first inductance element and a first capacitive element, a series-connected circuit composed of a second switch means and a second capacitive element is connected in parallel to the intermediate frequency tuning circuit, and the first switch means and the second switch means are turned on/off together.

Furthermore, the mixer has a pair of output ports, the intermediate frequency amplifier has a pair of input ports, the intermediate frequency tuning circuit is connected between the pair of output ports, one of the output ports is connected to one of the input ports, and the other output port is connected to the other input port through the trap circuit.

Also, a center point of the first inductance element is applied with a power supply voltage, the output ports of the mixer are supplied with the power supply voltage through the inductance element, one end of the trap circuit is connected to the other output port, the first switch means is composed of a first transistor of which a collector is connected to the other output port and of which an emitter is connected to the other input port and is grounded through a first resistor, the second switch means is composed of a second transistor of which a collector is connected to one of the output ports and of which an emitter is connected to the other output port through the second capacitive element and is grounded through a second resistor, and a base of the second transistor is connected to a base of the first transistor.

Moreover, the mixer and the intermediate frequency amplifier are formed within a same integrated circuit, and the first and second transistors and the first and second resistors are formed within the integrated circuit.

A mixer for outputting an intermediate frequency signal, an intermediate frequency amplifier provided at a rear stage of the mixer, an intermediate frequency tuning circuit interposed between the mixer and the intermediate frequency amplifier for tuning to the intermediate frequency signal, and a trap circuit interposed between the mixer and the intermediate frequency amplifier for attenuating a signal of an adjacent channel are comprised and a first switch means is connected in parallel to the trap circuit. Accordingly, when connecting a detector to input ports of the mixer or input ports of the intermediate frequency amplifier, the switch means is turned on and thus the influence of the trap circuit is eliminated and the RF characteristic up to the mixer stage can be observed.

The intermediate frequency tuning circuit is constructed by a parallel-connected circuit composed of a first inductance element and a first capacitive element, a series-connected circuit composed of a second switch means and a second capacitive element is connected in parallel to the intermediate frequency tuning circuit, and the first switch means and the second switch means are turned on/off together. Accordingly, if two switch means are turned on, a frequency of the tuning circuit is significantly detuned and thus the RF characteristic at the output ports of the intermediate frequency amplifier can be observed, without being influenced by the intermediate frequency tuning circuit and the trap circuit.

The mixer has a pair of output ports, the intermediate frequency amplifier has a pair of input ports, the intermediate frequency tuning circuit is connected between the pair of output ports, one of the output ports is connected to one of the input ports, and the other output port is connected to the other input port through the trap circuit. Accordingly, a balanced circuit can be constructed.

A center point of the first inductance element is applied with a power supply voltage, the output port of the mixer is supplied with the power supply voltage through the inductance element, one end of the trap circuit is connected to the other output port, the first switch means is composed of a first transistor of which a collector is connected to the other output port and of which an emitter is connected to the other input port and is grounded through a first resistor, the second switch means is composed of a second transistor of which a collector is connected to one of the output ports and of which an emitter is connected to the other output port through the second capacitive element and is grounded through a second resistor, and a base of the second transistor is connected to a base of the first transistor. Accordingly, two switch means can be turned on/off together.

The mixer and the intermediate frequency amplifier are formed within a same integrated circuit, and the first and second transistors and the first and second resistors are formed within the integrated circuit. Accordingly, the structure thereof can be simplified.

DESCRIPTION OF THE PREFERRED EMBODIMENT

Hereinafter, embodiments of the present invention will now be described with reference to the accompanying drawings.

Figure 1:
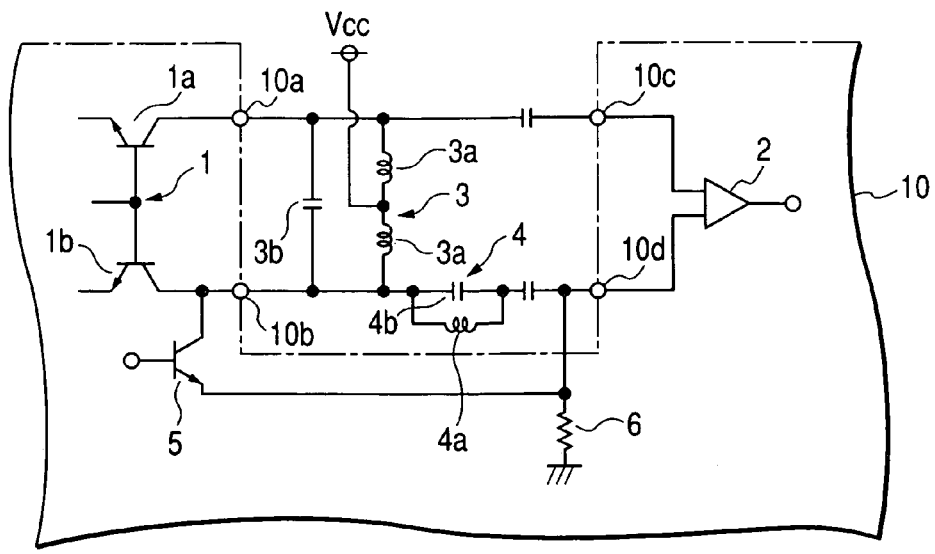
FIG. 1 is a circuit diagram showing a structure of a first embodiment relating to an intermediate frequency circuit of the present invention.

FIG. 1 shows a structure of a first embodiment relating to an intermediate frequency circuit of the present invention. A mixer 1 for converting a frequency and an intermediate frequency amplifier 2 are formed within an integrated circuit 10. The mixer 1 is provided with a pair of transistors at output ports thereof and the output ports (collector) are connected to a pair of balanced output ports 10a, 10b of the integrated circuit 10. Also, the input ports of the intermediate frequency amplifier 2 are connected to a pair of balanced input ports 10c, 10d of the integrated circuit 10. An intermediate frequency tuning circuit 3 and a trap circuit 4 are interposed between the balanced output ports 10a, 10b and the balanced output ports 10c, 10d.

The intermediate frequency tuning circuit 3 is constructed by a parallel-connected tuning circuit composed of a first inductance element 3a and a first capacitive element 3b and is connected between the balanced output ports 10a, 10b. The tuning frequency is approximately tuned to a center frequency of the intermediate frequency band. A power supply voltage Vcc is applied to the intermediate tap point of the first inductance element 3a and then is supplied to the collectors of the transistors 1a, 1b through the first inductance elements 3a, 3a. Further, one output port 10a is connected to one input port 10c, and the other output port 10b is connected to the other input port 10d through the trap circuit 4. The trap circuit 4 is constructed by a parallel-connected circuit composed of an inductance element 4a and a capacitive element 4b, and resonates at a video intermediate frequency or an audio intermediate frequency of the intermediate frequency band of the adjacent channel.

Within the integrated circuit 10, a first transistor 5 is formed as a first switch means. The collector of the first transistor 5 is connected to the other output port 10b, and an emitter thereof is connected to the other input port 10d and is grounded through a first resistor 6. Also, the resistor 6 is formed within the integrated circuit 10. Moreover, when observing a transfer characteristic (RF characteristic) up to a front stage of the mixer 1, for example, a detector having a low impedance (about 75Ω) is connected to one output port 10a or one input port 10c and the transistor 5 is turned on. Then, the intermediate frequency tuning circuit 3 is Q-damped and both ends of the trap circuit 4 are short-circuited, and thus waveform showing the RF characteristic detected by the output port 10a or the input port 10c can be observed.

Figure 2:
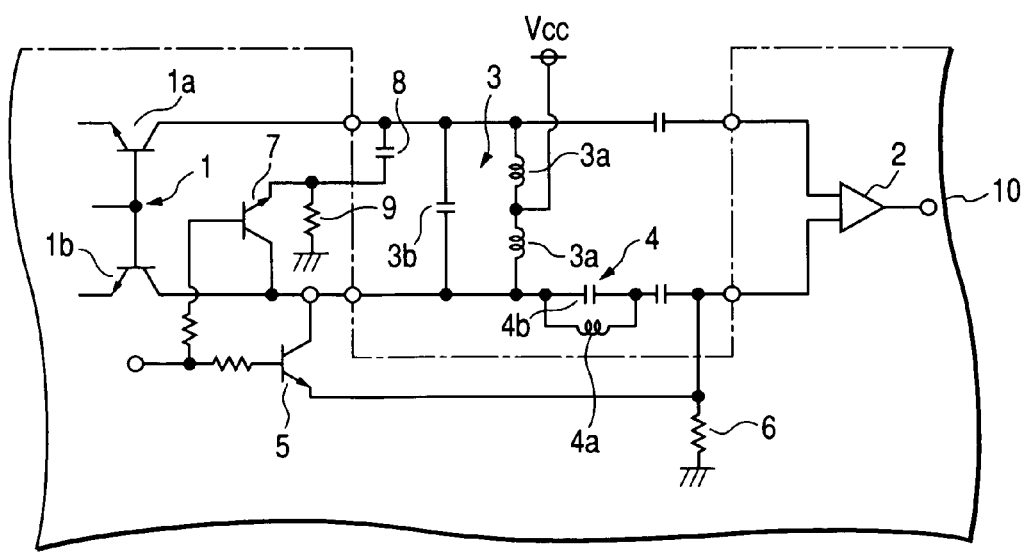
FIG. 2 is a circuit diagram showing a structure of a second embodiment relating to an intermediate frequency circuit of the present invention.
Figure 3:
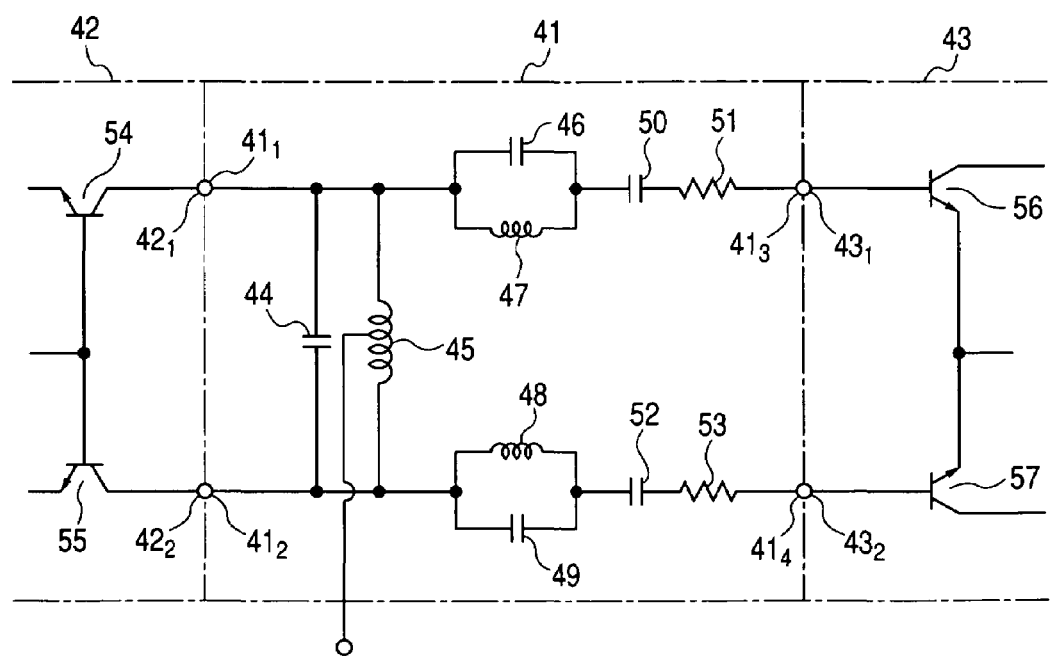
FIG. 3 is a circuit diagram showing a structure of a conventional intermediate frequency circuit.

FIG. 2 shows a structure of the second embodiment relating to the intermediate frequency circuit of the present invention. A series-connected circuit composed of a second transistor 7 as a second switch means and a second capacitive element 8 is connected in parallel to the intermediate frequency tuning circuit 3. In other words, the collector of the second transistor is connected to one of output ports (the other output port 10b in FIG. 2), and the emitter thereof is connected to the other output port (the output port 10a in FIG. 2) through a second capacitive element 8. In addition, the emitter is grounded through a second resistor 9. The base thereof is connected to the base of the first transistor 5. Also, the second transistor 7 and the second resistor 9 are formed within the integrated circuit 10. The remaining structure is equal to that shown in FIG. 1.

According to the above-mentioned structure, if a voltage is applied to the bases of the first and second transistors 5, 7 so that the transistors are turned on together when observing RF characteristic, the tuning frequency is significantly detuned from the intermediate frequency band because the second capacitive element 8 is connected in parallel to the intermediate frequency tuning circuit 3. Also, both ends of the trap circuit 4 are short-circuited, similar to FIG. 1. Accordingly, the RF characteristic can be observed by connecting the detector to the output port of the intermediate frequency amplifier 2.

What is claimed is:

1. An intermediate frequency circuit comprising:
   a mixer for outputting an intermediate frequency signal;
   an intermediate frequency amplifier provided at a rear stage of the mixer;
   an intermediate frequency tuning circuit interposed between the mixer and the intermediate frequency amplifier for tuning to the intermediate frequency signal; and
   a trap circuit interposed between the mixer and the intermediate frequency amplifier for attenuating a signal of an adjacent channel,
   wherein a first switch means is connected in parallel to the trap circuit.

2. The intermediate frequency circuit according to claim 1,
   wherein the intermediate frequency tuning circuit is constructed by a parallel-connected circuit composed of a first inductance element and a first capacitive element, a series-connected circuit composed of a second switch means and a second capacitive element is connected in parallel to the intermediate frequency tuning circuit, and the first switch means and the second switch means are turned on/off together.

3. The intermediate frequency circuit according to claim 2,
   wherein the mixer has a pair of output ports, the intermediate frequency amplifier has a pair of input ports, the intermediate frequency tuning circuit is connected between the pair of output ports, one of the output ports is connected to one of the input ports, and the other output port is connected to the other input port through the trap circuit.

4. The intermediate frequency circuit according to claim 3,
   wherein a center point of the first inductance element is applied with a power supply voltage, the output ports of the mixer are supplied with the power supply voltage through the inductance element, one end of the trap circuit is connected to the other output port, the first switch means is composed of a first transistor of which a collector is connected to the other output port and of which an emitter is connected to the other input port and is grounded through a first resistor, the second switch means is composed of a second transistor of which a collector is connected to the one of the output ports and of which an emitter is connected to the other output port through the second capacitive element and is grounded through a second resistor, and a base of the second transistor is connected to a base of the first transistor.

5. The intermediate frequency circuit according to claim 4,
   wherein the mixer and the intermediate frequency amplifier are formed within a same integrated circuit, and the first and second transistors and the first and second resistors are formed within the integrated circuit.

* * * * *